(12) United States Patent
Do et al.

(10) Patent No.: US 8,400,845 B2
(45) Date of Patent: Mar. 19, 2013

(54) COLUMN ADDRESS STROBE WRITE LATENCY (CWL) CALIBRATION IN A MEMORY SYSTEM

(75) Inventors: Lydia M. Do, Raleigh, NC (US); William M. Zevin, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 12/985,481

(22) Filed: Jan. 6, 2011

(65) Prior Publication Data

US 2012/0176850 A1  Jul. 12, 2012

(51) Int. Cl.
*G11C 7/10* (2006.01)

(52) U.S. Cl. .......... 365/189.04; 365/185.13; 365/185.25

(58) Field of Classification Search .................. 365/193, 365/194, 229, 230.08, 189.05, 191, 230.06, 365/189.12, 230.01, 226, 233
See application file for complete search history.

(56) References Cited

U.S. PATENT DOCUMENTS

| 7,239,576 | B2 | 7/2007 | Shimbayashi | |
|---|---|---|---|---|
| 7,663,946 | B2 * | 2/2010 | Kim | 365/194 |
| 2002/0188816 | A1 * | 12/2002 | Johnson et al. | 711/167 |
| 2010/0156488 | A1 * | 6/2010 | Kim et al. | 327/158 |
| 2010/0177587 | A1 * | 7/2010 | Huang | 365/230.08 |
| 2010/0299644 | A1 | 11/2010 | Kawai | |

FOREIGN PATENT DOCUMENTS

WO  02099661 A2  12/2002

OTHER PUBLICATIONS

International Search Report and Written Opinion of the ISA dated Apr. 17, 2012—International Application No. PCT/IB2011/055868.
DDR4 Write Leveling; Item 1716.49; Memory Division Samsung Electronics Co., Ltd.; Jun. 2009; 1-9 pages.
DDR4 Write Leveling, Item 1716.49; Memory Division Samsung Electronics Co., Ltd.; Mar. 2010 1-14 pages.

\* cited by examiner

*Primary Examiner* — Dang Nguyen
(74) *Attorney, Agent, or Firm* — Cantor Colburn LLP

(57) ABSTRACT

Column address strobe write latency (CWL) calibration including a method for calibrating a memory system. The method includes entering a test mode at a memory device and measuring a CWL at the memory device. A difference between the measured CWL and a programmed CWL is calculated. The calculated difference is transmitted to a memory controller that uses the calculated difference for adjusting a timing delay to match the measured CWL.

14 Claims, 6 Drawing Sheets

COLUMN ADDRESS STROBE WRITE LATENCY (CWL) CALIBRATION IN A MEMORY SYSTEM

BACKGROUND

The present invention relates to memory systems, and more specifically, to column address strobe write latency (CWL) calibration in a memory system.

Present memory interface architectures allow different timing relationships between the command/address/control/clock interface (referred to herein as "address and control logic") and the data bus at each dynamic random access memory (DRAM) in a memory system. Contemporary architectures include a wiring topology known as "fly-by." Although this topology improves signal quality, it comes at the expense of flight time (propagation) delay between the nearest and farthest DRAM in a memory subsystem. The relationship between the address and control logic, and the data bus (skew) may create difficulty for a memory controller to assure specific DRAM timing parameters at each DRAM. The memory controller must calibrate data path delays for each DRAM in the system to assure proper timing relationships to the address and control logic.

One such timing relationship is the edge alignment of a write data strobe (DQS) to the memory clock as perceived by the DRAM. There is no requirement, nor strong need, to have a specific wiring relationship between the address/control logic path and the data path to each DRAM. Hence, the timing relationships between these two interfaces changes at each DRAM and signals on both these interfaces must arrive at each DRAM with the proper timing relationship. There is a common industry methodology to variably delay the memory controller's data path to each DRAM and calibrate this delay structure to assure proper timing relationships at the DRAM. Write leveling is used to indicate such a calibration process that involves a test mode that is entered by commanding the DRAM, via a mode register command, to align the DQS, to the memory reference clock, as seen by the DRAM. This process does not assure that, for normal write commands, the data strobes are on the correct clock cycle. Write leveling assures a basic core timing relationship between a data strobe edge and 'any given' clock edge. It does not assure that proper CWL will be maintained.

With increasing operating rates (frequency/speed) of the interfaces, propagation delay can become significant. As propagation delay closes in on, or exceeds the clock period (operating frequency/data rate), the skew between the command interface and data interface can change significantly relative to the memory controller and any particular DRAM device. This is because the address and control logic signals can travel much farther in distance than their companion data interface signals. From the perspective of the memory controller, the write command and data strobe will have the programmed delay that it believes meets the required CWL requirement, however, due to the possibility of increasing skew between the address/control logic and the data bus, at each DRAM, the proper CWL might not be achieved at the DRAM.

Contemporary methodologies for validating CWL are based on a trial and error approach. A write/read cycle is executed by a memory controller to determine if data written, by a write command to a memory address, is returned correctly in response to a read command to the same memory address. Matching return data implies that the write is being performed with the correct CWL. Incorrect return data can imply the need to adjust the CWL, either forward or backward, and then requires re-testing with another write/read cycle. The trial and error approach of the current methodology can cause certain DRAMs to fail, and may require other methods of circumvention (e.g., issue two identical writes to flush the write through). The trial and error approach can be performed using a hardware assist (e.g., a state machine) and/or low level software (e.g., firmware) to perform a write/read compare operation and cycle adjustment until a successful compare is found.

A drawback to contemporary approaches is that it may be difficult to assure proper DRAM behavior when attempting to find the proper write latency with a trail and error approach. Another drawback is the amount of time required during initialization to perform numerous iterations, particularly when using a single service processor to initialize memory systems with large memory arrays.

Accordingly, and while existing memory systems may be suitable for their intended purposes, there remains a need in the art for memory systems that overcome these drawbacks for memory designs that have differences in timing relationships between the memory controller and numerous connected memory devices that operate at high frequency.

SUMMARY

An embodiment is a method for calibrating a memory system. The method includes entering a test mode at a memory device and measuring a column address strobe write latency (CWL) at the memory device. A difference between the measured CWL and a programmed CWL is calculated. The calculated difference is transmitted to a memory controller that uses the calculated difference for adjusting a timing delay to match the measured CWL.

Another embodiment is a memory device that includes an interface to a memory controller and a memory device column address strobe write latency (CWL) calibrator. The memory device CWL is configured for entering a test mode at the memory device and measuring a CWL at the memory device. A difference between the measured CWL and a programmed CWL is calculated. The calculated difference is transmitted to a memory controller that uses the calculated difference for adjusting a timing delay to match the measured CWL.

A further embodiment is a method for calibrating a memory system. The method includes transmitting a test mode command from a memory controller to a memory device. The test mode command instructs the memory device to enter a test mode to calculate a difference between a measured CWL and a programmed CWL. A write command is transmitted to the memory device followed by a data strobe. The data strobe follows the write command by a timing delay of a number of clock cycles corresponding to the programmed CWL. A response that includes the difference between the measured CWL and the programmed CWL is received from the memory device. The timing delay is updated based on the difference between the measured CWL and the programmed CWL.

A further embodiment is a memory controller that includes an interface to a memory device, and a memory controller CWL calibrator for transmitting a test mode command to the memory device. The test mode command instructs the memory device to enter a test mode to calculate a difference between a measured CWL and a programmed CWL. The CWL calibrator is also for transmitting a write command to the memory device followed by a data strobe. The data strobe follows the write command by a timing delay of a number of clock cycles corresponding to the programmed CWL. A response that includes the difference between the measured CWL and the programmed CWL is received from the memory device. The timing delay is updated based on the difference between the measured CWL and the programmed CWL.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment is utilized to adjust timing delays in a memory system to account for column address strobe write latency (CWL). In an embodiment, the memory controller delays are calibrated using a deterministic approach, where both a memory controller and a dynamic random access memory (DRAM) device participate in a feedback mechanism that allows the memory controller to align write strobes with the proper clock cycle to assure the correct CWL at the DRAM. As described herein, the memory controller and DRAM device components are placed in a test mode such that the memory controller can learn the proper write latency to any DRAM device within the memory system. The memory controller learns the proper data bus delays using a simple response mechanism to convey any required clock cycle adjustment to align future write data to the appropriate clock, from the perspective of the DRAM device.

Figure 1:
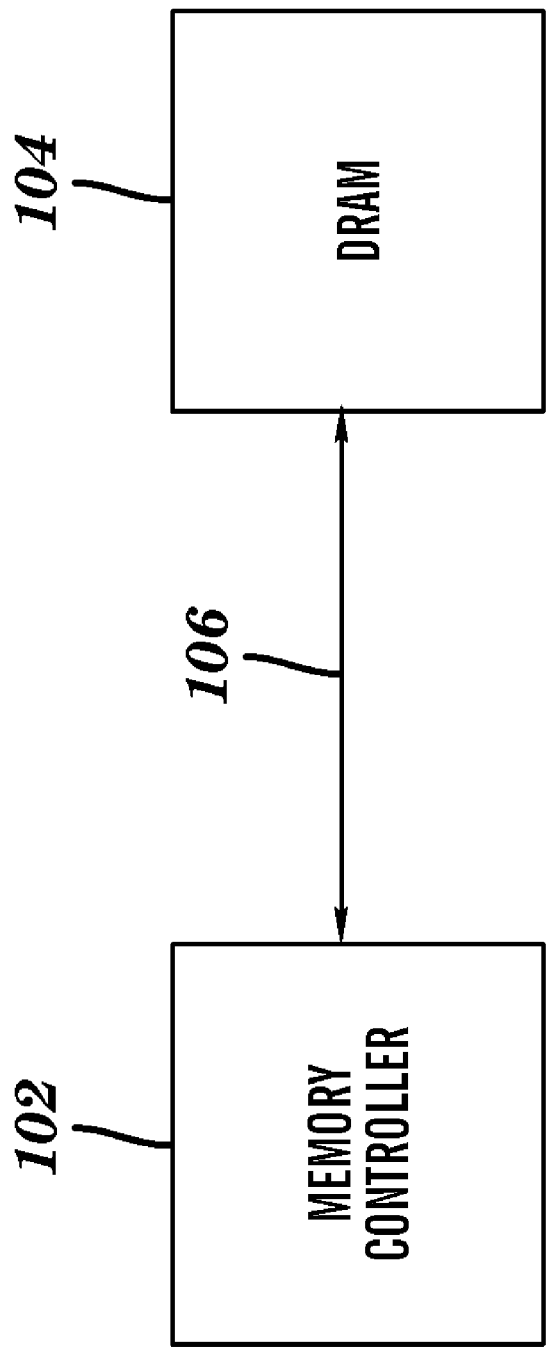
FIG. 1 depicts a block diagram of a memory system where column address strobe write latency (CWL) is calibrated for a memory device in accordance with an embodiment.

FIG. 1 depicts a block diagram of a memory system where CWL is being calibrated for a DRAM device 104 in accordance with an embodiment. As shown in FIG. 1, a memory controller 102 is in communication with one DRAM device 104 via a memory bus 106. In one embodiment, the memory bus 106 is bi-directional. In another embodiment the memory bus 106 includes two uni-directional busses. In an embodiment, the memory bus 106 transmits address/command/clock (this portion of the memory bus is also referred to herein as the "address and control logic interface") and a data strobe between the memory controller 102 and the DRAM device 104.

The examples described herein are directed to memory systems having DRAM memory devices, however embodiments apply to any memory systems that include memory devices having a wait time before being able to access a memory cell after a write command is issued (e.g., a write latency).

As used herein, the term "memory controller" refers to any device that controls access to a memory device. A memory controller may be included as part of a processor, as a stand alone processor or in a memory hub or buffer device. In an embodiment, the memory controller also controls the physical layer interface signals (e.g., via additional delay elements) to the DRAM device. The memory controller and the memory device require CWL calibration so that write data can be stored properly by the memory device.

Figure 2:
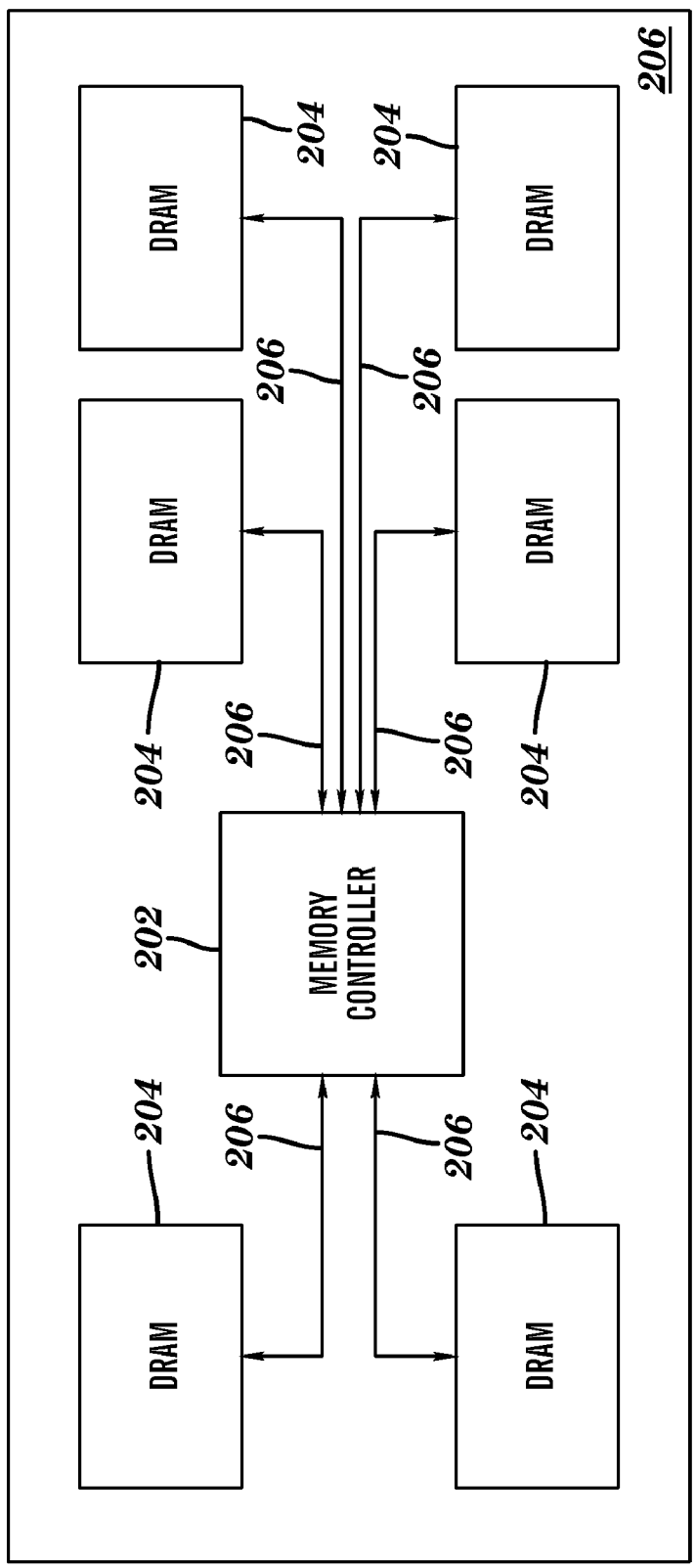
FIG. 2 depicts a block diagram of a memory system were the CWL is calibrated in parallel for multiple memory devices in accordance with an embodiment.

FIG. 2 depicts a block diagram of a memory system were CWL is being calibrated in parallel for multiple DRAM devices 204 in accordance with an embodiment. As shown in FIG. 2, a memory controller 202 is in communication with a plurality of DRAM devices 204 via a plurality of memory buses 206. As shown in FIG. 2, the memory controller 202 and DRAM devices 204 are located on a memory module 208. In an embodiment, the memory controller 202 is located on or included in a hub device or buffer device located on the memory module 208. In an embodiment, the memory controller 202 located on the memory module 208 is in communication with another memory controller (not shown) that controls the memory module 208 and possibly other memory modules. In one embodiment, the memory buses 206 are bi-directional. In another embodiment the memory buses 206 include two uni-directional busses. In an embodiment, the memory buses 206 transmit clock, data, commands, and a data strobe between the memory controller 202 and the DRAM devices 204.

Figure 3:
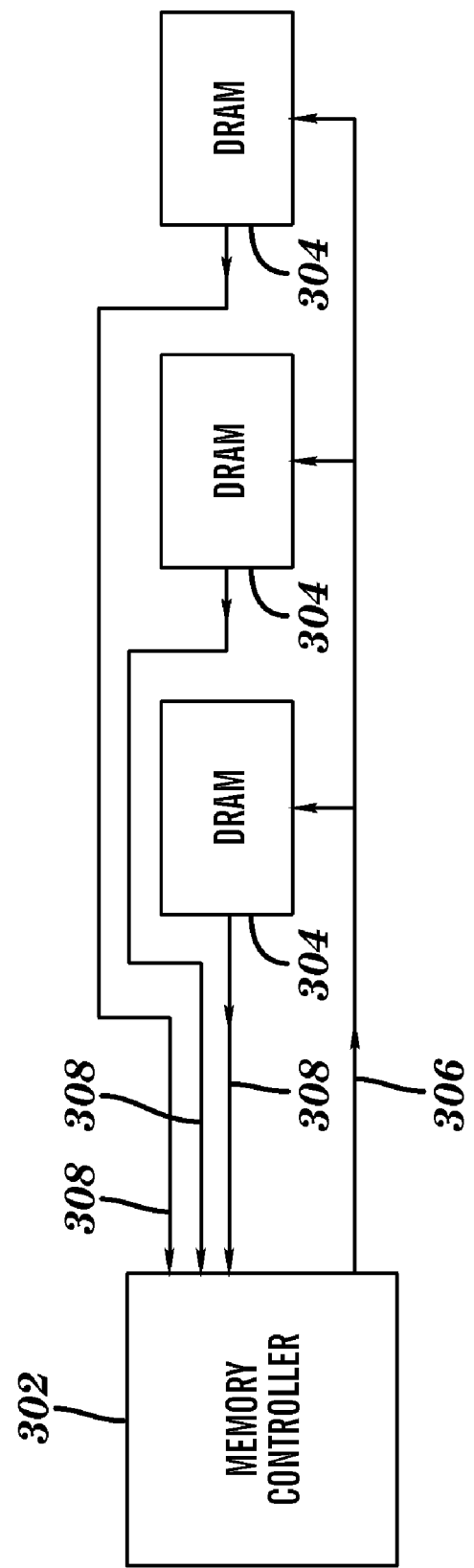
FIG. 3 depicts a block diagram of a memory system were the CWL is calibrated separately for multiple memory devices in accordance with an embodiment.

FIG. 3 depicts a block diagram of a memory system where the CWL is being calibrated in parallel (or separately) for multiple memory devices in accordance with an embodiment. As shown in FIG. 3, a memory controller 302 is in communication with a plurality of DRAM devices 304 via a shared address/command/clock bus 306 (also referred to herein as an "address and control logic interface"). Also as shown in FIG. 3, each DRAM has its own data interface 308 (e.g., a data bus) for connecting to the memory controller 302 (i.e., there is a single load per data interface). In another embodiment (not shown), multiple DRAM devices share the same data interface.

Figure 4:
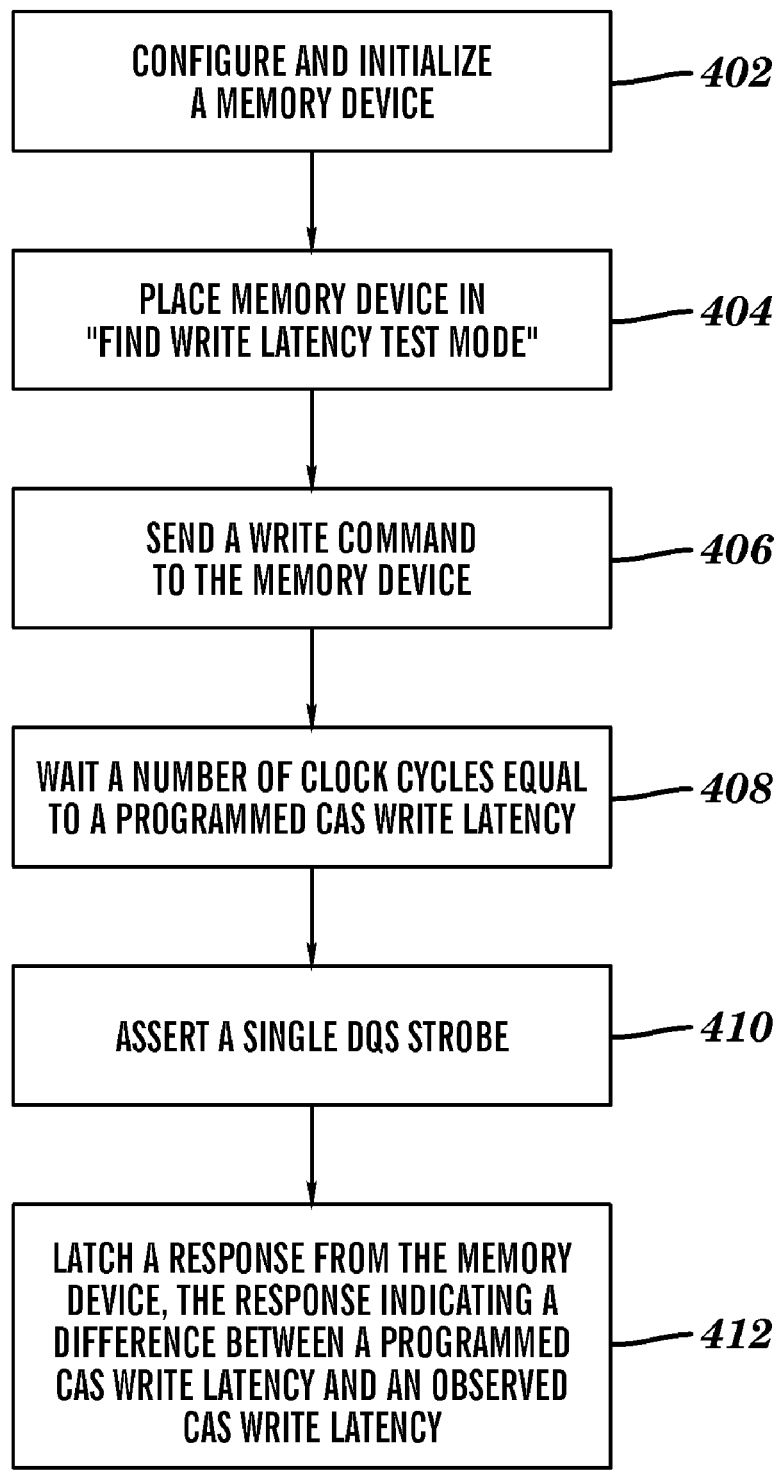
FIG. 4 depicts a process flow implemented by a memory controller to perform CWL calibration in accordance with an embodiment.

FIG. 4 depicts a process flow implemented by a memory controller, such as memory controller 102, to perform CWL calibration in accordance with an embodiment. In an embodiment, all or part of the processing in FIG. 4 is performed by a portion of the memory controller referred to herein as a memory controller CWL calibrator. The memory controller configures and initializes a DRAM(s), such as DRAM 104, at block 402. The configuring performed by the memory controller is based on defined standards and practices and includes configuring (e.g., programming) the DRAM with a specific CWL value. The DRAM initialization is also based on defined standards and practices and includes performing write leveling by aligning a write data strobe (DQS) with a clock signal at the DRAM device. At block 404, the memory controller places the memory device in a "find-write-latency" (FWL) test mode. In an embodiment, the memory controller sends a mode register (MR) command to the DRAM instructing the DRAM to enter a FWL test mode. In an embodiment, the memory controller also performs a temporary adjustment so that clock is centered within the write data strobe while the DRAM is in FWL test mode. This allows for easier sampling of the write data strobe by the DRAM device.

After a pre-determined minimum amount of time, to allow the DRAM to enter the FWL test mode, block 406 is performed and the memory controller sends a write command to the memory device. Then, at block 408, the memory controller waits a number of clock cycles equal to the programmed CWL value for the DRAM device. The programmed CWL value is the CWL value defined by the configuring performed in block 402. Additional delay might also be required based on the results of the write leveling calibration process. Next, at block 410, the memory controller asserts a single data strobe (DQS). At block 412, the memory controller waits a predetermined amount of time and then enables its data receivers to latch a response from the DRAM device. In an embodiment, the response indicates the difference (e.g., in clock cycles) between the CWL value observed by the DRAM and the CWL value that the DRAM device expects (i.e., the CWL value programmed during the configuring performed in block 402). In an embodiment, the memory controller adjusts its timing delays based on the response and uses this adjusted value when performing writes to the memory device. In an embodiment, after block 412 is complete, the memory controller places the DRAM back into normal operation mode (e.g., via a mode register command). It will be appreciated by those skilled in the art that returning to normal operation includes resetting the strobe to be edge aligned with the clock.

Figure 5:
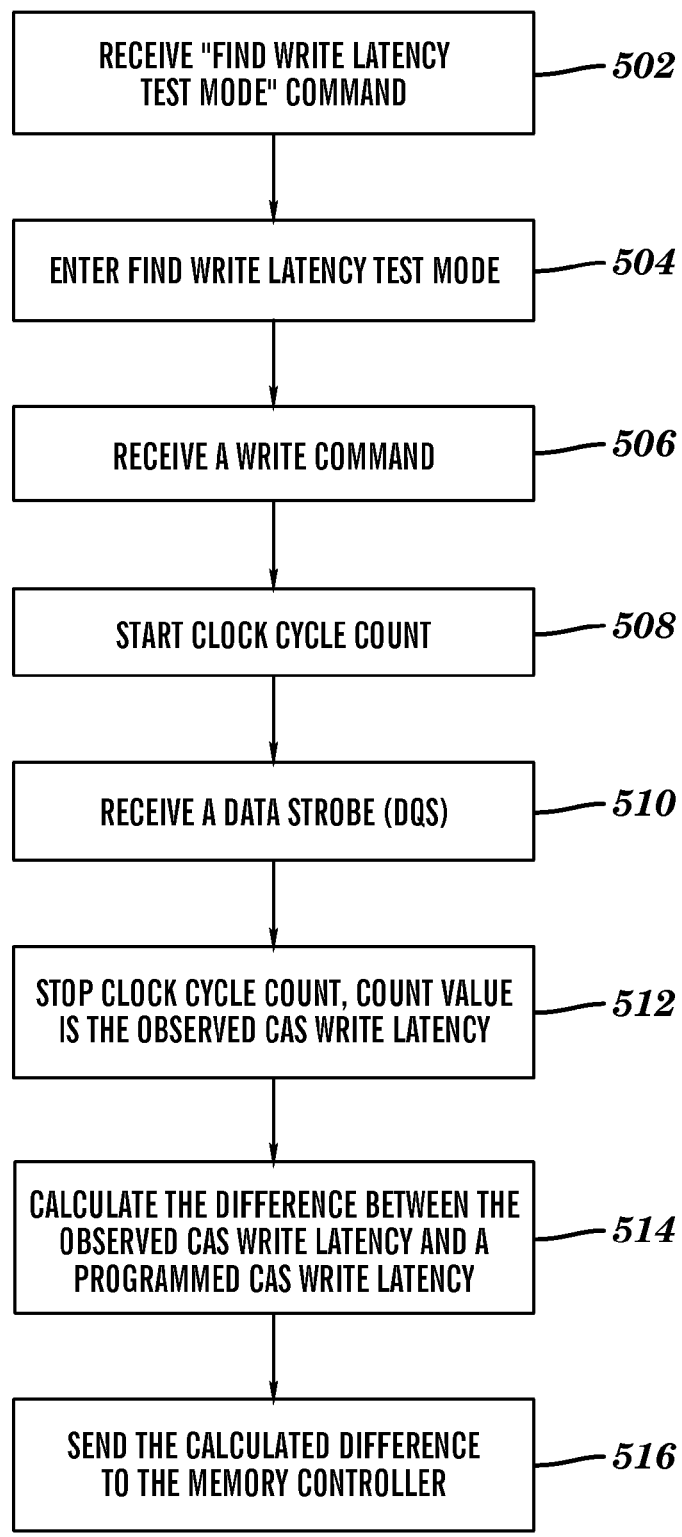
FIG. 5 depicts a process flow implemented by a memory device to perform CWL calibration in accordance with an embodiment.

FIG. 5 depicts a process flow implemented by a DRAM device, such as DRAM device 104, to perform CWL calibration in accordance with an embodiment. In an embodiment, the processing is performed by a portion of the DRAM device referred to herein as a "memory device CWL calibrator." At block 502, the DRAM device receives a FWL test mode command from a memory controller, such as memory controller 102, and at block 504 the DRAM device enters the FWL test mode where it waits for a write command. At block 506, the DRAM device receives the write command from the memory controller and at block 508 starts counting clock cycles. When the DRAM sees the DQS at block 510, it stops the clock cycle count at block 512. The value of the clock cycle count is the observed CWL value. In an embodiment, a timeout occurs if the DQS is not received within the maximum number of clock cycles that can be reported within the response. At block 514, the DRAM calculates the difference between the observed CWL value and the CWL value programmed into the DRAM by the memory controller during system configuration (also referred to herein as the programmed CWL). The calculated difference is sent to the memory controller at block 516. If a timeout occurs, the maximum reportable difference is reported back to the memory controller. It is expected that if the maximum reported response is returned, the memory controller will iterate the calibration request until a zero response is returned.

Figure 6:
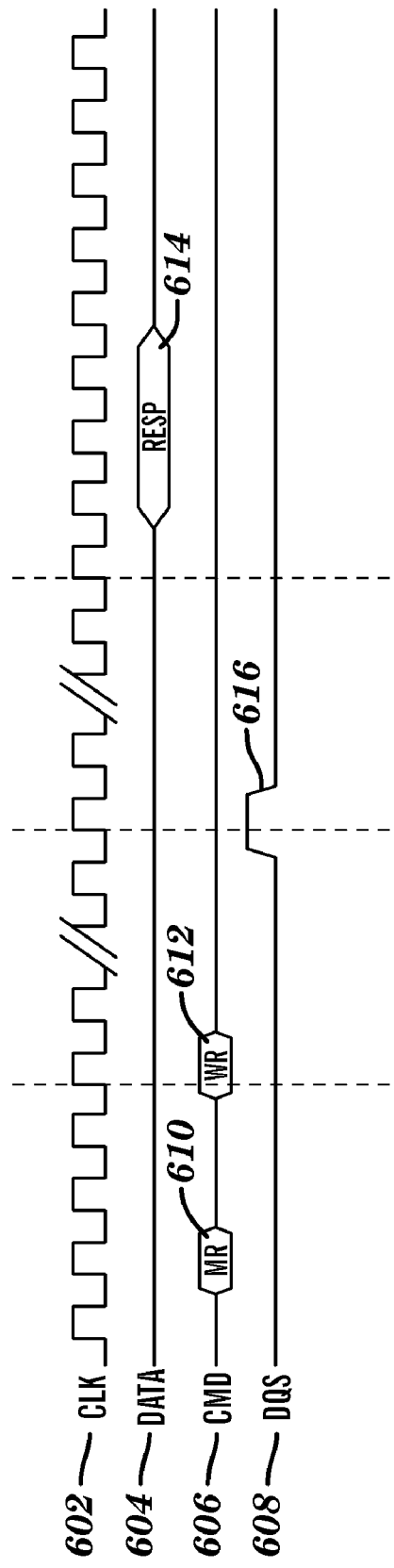
FIG. 6 depicts a timing diagram for performing CWL calibration in accordance with an embodiment.

FIG. 6 depicts a timing diagram for performing CWL calibration in accordance with an embodiment. The timing diagram includes a clock bus 602, a data bus 604, an address/command bus 606, and a data strobe 608. As shown in the embodiment in FIG. 6, the memory controller sends a mode register command 610 specifying a FWL test mode to the DRAM device via the address/command bus 606. Also shown in FIG. 6, is a write command 612 being sent on the address/command bus 606 from the memory controller to the DRAM device, followed by a strobe 616 on the data strobe 608. As described previously with respect to FIG. 4, above, the number of clock cycles between the write command 612 being sent and the strobe 616 is equal to the programmed CWL value as determined by the memory controller during system configuration.

Also shown in FIG. 6, is a response 614 coming back from the DRAM device to the memory controller via the data bus 604. As described previously with respect to FIG. 5, the response 614 includes data that indicates any difference between an observed CWL value (observed at the DRAM device) and the programmed CWL value. Contents of the response 614 are used to adjust the relationship between write command and data strobe to account for the disparity in programmed versus observed CWL which is due to the propagation delays inherent in the fly-by topology architecture of the command/address/clock bus. The programmed CWL refers to the CWL value expected by the memory controller and the DRAM as determined during system configuration.

An embodiment supports both x4 DRAMS that are four bits wide and x8 DRAMS that are eight bits wide by limiting the response 614 to four bits. In an embodiment where bit order significance is known, the four bits include one sign bit and three information bits representing the delta between observed CWL and a DRAM's programmed CWL. Limiting the response 614 to four bits allows support for a +7 or −7 clock difference between the observed and programmed CWL. In an embodiment, a zero response 614 indicates that the memory controller and the DRAM are in sync with regards to CWL.

In most implementations, the ability to support up to 7 clocks of difference is sufficient. However, in other embodiments, more than 7 clocks of difference are supported by extending the architecture such that if the maximum delta is reported, the memory controller adjusts the delay values and iterates the calibration request until it receives a zero in the response 614. Upon detection of a zero response 614, the calibration is complete with the proper delays to assure CWL.

In an embodiment, where the order of the bits in the response have no known significance, the number of one bits and zero bits are counted and translated into a value that represents the difference between the programmed CWL and the observed CWL. In this embodiment, the ability to support large differences between observed and programmed CWL is limited. If the maximum difference is reported, the memory controller adjusts the delay values and iterates the calibration request until it receives a zero in the response 614. Upon detection of a zero response 614, the calibration is complete with the proper delays to assure CWL.

Technical effects and benefits include the ability to deterministically calibrate delays associated with CWL for a memory device. The elimination of firmware (with or without hardware assist) validation methods to correct improper delays associated with CWL may lead to improved system initialization time and reliability.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for calibrating a memory system, the method comprising:
    entering a test mode at a memory device;

measuring a column address strobe write latency (CWL) at the memory device, the measuring comprising:
  receiving a write command from the memory controller;
  receiving a data strobe from the memory controller; and
  counting a number of clock cycles between receiving the write command and receiving the data strobe;
calculating a difference between the measured CWL and a programmed CWL; and
transmitting the calculated difference to a memory controller, the memory controller using the calculated difference for adjusting a timing delay to match the measured CWL.

2. The method of claim 1, wherein the entering a test mode is in response to receiving a command from the memory controller.

3. The method of claim 1, further comprising receiving the programmed CWL from the memory controller.

4. The method of claim 1, wherein the calculated difference is coded as a number of one bits and zero bits.

5. The method of claim 1, wherein the difference is measured in clock cycles.

6. A memory device comprising:
an interface to a memory controller; and
a memory device column address strobe write latency (CWL) calibrator for:
  entering a test mode at the memory device;
  measuring a CWL at the memory device, the measuring comprising:
    receiving a write command from the memory controller;
    receiving a data strobe from the memory controller; and
    counting a number of clock cycles between receiving the write command and receiving the data strobe;
  calculating a difference between the measured CWL and a programmed CWL; and
  transmitting the calculated difference to a memory controller, the memory controller using the calculated difference for adjusting a timing delay to match the measured CWL.

7. The memory device of claim 6, wherein the entering a test mode is in response to receiving a command from the memory controller.

8. The memory device of claim 6, wherein the memory device is a dynamic random access memory (DRAM) device.

9. The memory device of claim 6, wherein the calculated difference is coded as a number of one bits and zero bits.

10. The memory device of claim 6, wherein the difference is measured in clock cycles.

11. A method for calibrating a memory system, the method comprising:
transmitting a test mode command from a memory controller to a memory device, the test mode command instructing the memory device to enter a test mode to calculate a difference between a measured column address strobe write latency (CWL) and a programmed CWL;
transmitting a write command to the memory device;
transmitting a data strobe to the memory device, the data strobe following the write command by a timing delay of a number of clock cycles corresponding to the programmed CWL;
receiving a response from the memory device, the response comprising the difference between the measured CWL and the programmed CWL; and
updating the timing delay responsive to the difference between the measured CWL and the programmed CWL,
wherein the transmitting a write command, transmitting a data strobe, receiving a response and updating are performed until the difference between the measured CWL and the programmed CWL has a value of zero.

12. The method of claim 11, further comprising:
measuring the CWL at the memory device in response to receiving the test mode command from the memory controller;
calculating the difference at the memory device; and
transmitting the calculated difference from the memory device to the a memory controller.

13. A memory controller comprising:
an interface to a memory device; and
a memory controller column strobe address write latency (CWL) calibrator for:
  transmitting a test mode command to the memory device, the test mode command instructing the memory device to enter a test mode to calculate a difference between a measured CWL and a programmed CWL;
  transmitting a write command to the memory device;
  transmitting a data strobe to the memory device, the data strobe following the write command by a timing delay of a number of clock cycles corresponding to the programmed CWL;
  receiving a response from the memory device, the response comprising the difference between the measured CWL and the programmed CWL; and
  updating the timing delay responsive to the difference between the measured CWL and the programmed CWL,
  wherein the transmitting a write command, transmitting a data strobe, receiving a response and updating are performed until the difference between the measured CWL and the programmed CWL has a value of zero.

14. The memory controller of claim 13, further comprising a configuration register for storing the programmed CWL and registers that control the timing delay.

* * * * *